(12) United States Patent
Lin et al.

(10) Patent No.: US 6,753,595 B1
(45) Date of Patent: Jun. 22, 2004

(54) SUBSTRATES FOR SEMICONDUCTOR DEVICES WITH SHIELDING FOR NC CONTACTS

(75) Inventors: Wei Feng Lin, Hsinchu (TW); Chung Ju Wu, Kaohsiung (TW); Wen-Yu Lo, Taichung (TW); Wen-Dong Yen, Tainan (TW)

(73) Assignee: Silicon Integrated Systems Corp, Hsin Chu (TW)

( * ) Notice: Subject to any disclaimer, the term of this patent is extended or adjusted under 35 U.S.C. 154(b) by 0 days.

(21) Appl. No.: 10/341,363

(22) Filed: Jan. 14, 2003

(51) Int. Cl.[7] .......................... H05K 7/06; H01G 4/228
(52) U.S. Cl. ..................... 257/668; 257/728; 257/700; 257/701; 257/758; 257/738; 257/737; 257/698; 257/691; 361/777; 361/792; 361/795; 174/255; 174/261; 174/262
(58) Field of Search ................................. 257/668, 700, 257/701, 758, 691, 692, 693, 698, 696, 784, 786, 787, 697, 734, 737, 738, 728; 361/777, 792, 795; 174/255, 261, 262

(56) References Cited

U.S. PATENT DOCUMENTS 5,990,547 A * 11/1999 Sharma et al. .............. 257/700

| 2002/0085334 A1 | * | 7/2002 | Figueroa et al. ......... 361/301.4 |
| 2002/0139571 A1 | * | 10/2002 | Mizunashi .................. 174/255 |
| 2002/0180015 A1 | * | 12/2002 | Yamaguchi et al. ......... 257/678 |
| 2002/0181185 A1 | * | 12/2002 | Kabumoto et al. ...... 361/306.3 |

FOREIGN PATENT DOCUMENTS

| JP | 04-226097 | * | 8/1992 |
| JP | 2000-31329 | * | 1/2000 |
| JP | 2002-217545 | * | 8/2002 |

* cited by examiner

Primary Examiner—Alexander Oscar Williams
(74) Attorney, Agent, or Firm—Birch, Stewart, Kolasch & Birch, LLP

(57) ABSTRACT

A substrate used in a semiconductor device. The substrate includes a first wiring layer, a second wiring layer, and an interconnection-wiring layer. The first wiring layer includes a plurality of first pads while the second wiring layer includes a plurality of second pads. The interconnection-wiring layer is set between the first and second wiring layer. In this case, at least one of the second pads isn't electrically connected with anyone of the first pads, and other second pads that located adjacent to this second pad, which is not electrically connected with the first pads, electrically connect to the interconnection-wiring layer. Furthermore, this invention also discloses a semiconductor device including the substrate.

13 Claims, 5 Drawing Sheets

SUBSTRATES FOR SEMICONDUCTOR DEVICES WITH SHIELDING FOR NC CONTACTS

BACKGROUND OF THE INVENTION

1. Field of Invention

The invention relates to a substrate for a semiconductor device and, in particular, to a substrate for a semiconductor device providing electrostatic discharge protection functions.

2. Related Art

Due to the high integrity and the needs of the consuming market, the sizes of semiconductor devices have become more compact. Therefore, many semiconductor package technologies have been developed, such as PGA (Pin Grid Array), BGA (Ball Grid Array), and wafer level packaging.

Among the aforementioned package technologies, the substrate 11 of a BGA semiconductor device 1 (as shown in FIG. 1) is used more efficiently to have more bumps 13. The bumps 13 electrically connect to the pads of the chip 12 via the trace lines and pads of the substrate 11. Since the number of the bumps is larger, the chip 12 can transmits larger amount of signals via the bumps 13.

Please refer to FIG. 2, the above-mentioned substrate 11 includes a first wiring layer 21, a ground interconnection-wiring layer 22, a power interconnection-wiring layer 23, and a second wiring layer 24. These four layers are stacked in sequence to form the substrate 11. The top surface of the first wiring layer 21 is provided with a plurality of first pads 211 for electrically connecting to the pads of the chip 12. Furthermore, a plurality of first trace lines 212 are formed in the first wiring layer 21. One end of each of the first trace lines 212 connects to a corresponding first pad 211.

The ground interconnection-wiring layer 22 and the power interconnection-wiring layer 23 connect to specific pads in the first wiring layer 21 (a ground ring) and specific pads of the second wiring layer 24 (a power ring), respectively, to provide a ground level and a power source level to the chip 12 from external circuits.

The bottom surface of the second wiring layer 24 is provided with a plurality of second pads 241, each of which is formed with a bump 13. Moreover, a plurality of second trace lines 242 are formed in the second wiring layer 24, one end of each of the second trace lines 242 connects to a corresponding second pads 241. Another end of each of the first trace lines 212 connects to another end of each of the second trace lines 242 via a via hole (not shown in the drawing). The pads of the chip 12 communicate with external circuits through the first pads 211, the first trace lines 212, the via holes, the second trace lines 242, the second pads 241, and the bumps 13.

From the above, since the number of second pads 241 of the substrate 11 for connecting to the bumps 13 usually exceeds the number of the pads of the chip 12, some of the bumps 13 are not electrically connected with pads of the chip 12. These bumps 13 are called NC Balls. More specifically, the second pads connected with the NC Balls do not connect with the second trace lines, thus the NC Balls do not electrically connected with any pad of the chip 12. The reason to reserve these NC Balls is to provide input/output terminals requirements when the function of the semiconductor device (such as the BGA semiconductor device 1 mentioned above) is increased. However, when the above-mentioned BGA semiconductor device 1 is under operation, the NC Balls are in a floating status. Under this situation, if an ESD (electrostatic discharge) test is performed on these NC Balls, the electrostatic charges may move into the chip, and then damage other functional pins. If this happens, the functions of the BGA semiconductor device will become abnormal.

Therefore, how to provide a semiconductor device with a superior ESD protection capability has become an important issue to be solved.

SUMMARY OF THE INVENTION

In view of the above, an objective of the invention is to provide a substrate for a semiconductor device with a superior ESD protection capability.

To achieve the above-mentioned objective, the substrate according to the invention includes a first wiring layer, a second wiring layer, and an interconnection-wiring layer. The top surface of the first wiring layer is provided with a plurality of first pads. The bottom surface of the second wiring layer is provided with a plurality of second pads. The interconnection-wiring layer is provided between the bottom surface of the first wiring layer and the top surface of the second wiring layer. In this invention, at least one of the second pads isn't electrically connected with anyone of the first pads, and other second pads that located adjacent to this second pad, which is not electrically connected with the first pads, electrically connect to the interconnection-wiring layer.

Furthermore, the invention also provides a semiconductor device, which includes the substrate mentioned above and a chip. The chip is provided on the first wiring layer of the substrate, and the pads of the chip are electrically connected with the first pads, respectively.

To sum up, the substrate and the semiconductor device according to the invention provide the level of interconnection-wiring layer to the second pads adjacent to the second pad, which is not connected with the first pads. Therefore, the second pad, which is not connected with the first pads, is shielded and connected with the mentioned NC Ball. As a result, the electrostatic discharge protection capability of a semiconductor device could be improved significantly.

BRIEF DESCRIPTION OF THE DRAWINGS

The invention will become more fully understood from the detailed description given herein below illustration only, and thus are not limitative of the present invention, and wherein.

DETAILED DESCRIPTION OF THE INVENTION

The substrate for a semiconductor device according to the preferred embodiment of the invention will be described herein below with reference to the accompany drawings, wherein the same reference numbers refer to the same elements.

Figure 1:
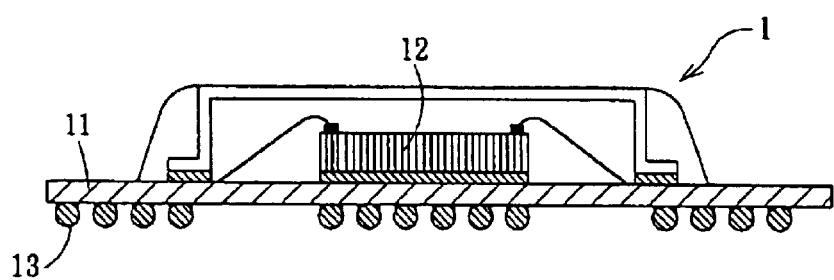
FIG. 1 is a schematic diagram showing a BGA-type semiconductor device in the prior art.
Figure 2:
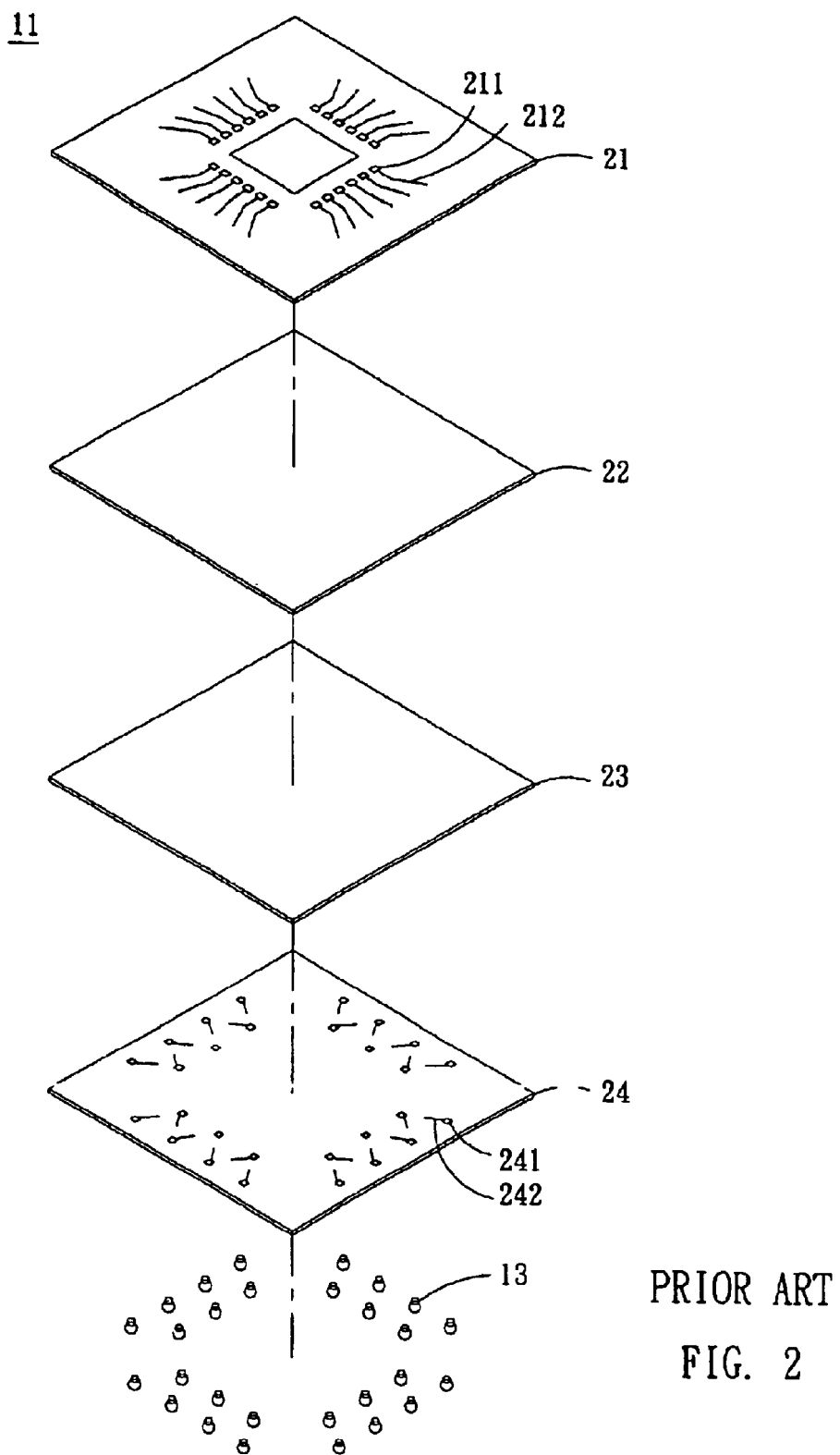
FIG. 2 is a schematic diagram showing the substrate of the BGA-type semiconductor device shown in FIG. 1.
Figure 3:
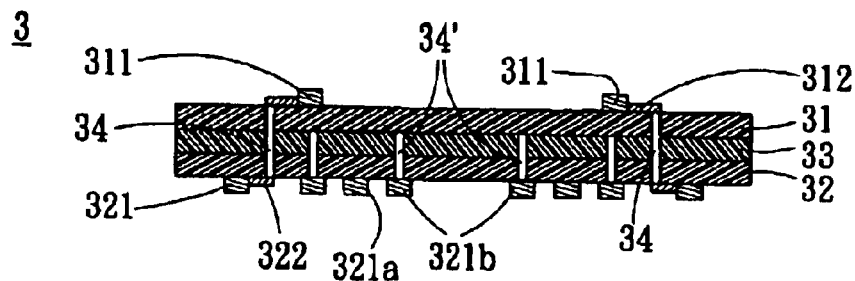
FIG. 3 is a schematic diagram showing a substrate according to an embodiment of the invention.

Please refer to FIG. 3, the substrate 3 according to a preferred embodiment of the invention includes a first wiring layer 31, a second wiring layer 32 and an interconnection-wiring layer 33.

The top surface of the first wiring layer 31 is provided with a plurality of first pads 311, with electrically connect to the pads of a chip (not shown). Moreover, a plurality of first trace lines 312 are formed in the first wiring layer 31. One end of each of the first trace lines 312 connects to a corresponding first pad 311, and the other end of each of the first trace lines 312 connects to a via hole 34.

The bottom surface of the second wiring layer 32 is provided with a plurality of second pads 321, on which bumps are formed. Furthermore, a plurality of second trace lines 322 are formed in the second wiring layer 32. One end of each of the second trace lines 322 connects to a corresponding second pad 321, and the other end of each of the second trace lines 322 electrically connects to the other end of a corresponding first trace line 312 through the via hole 34. In the present embodiment, at least one second pad 321 is not electrically connected with any of the first pads 311. Furthermore, the second pads 321 are arranged in an array, and the substrate 3 is a BGA (Ball Grid Array) substrate.

Figure 4:
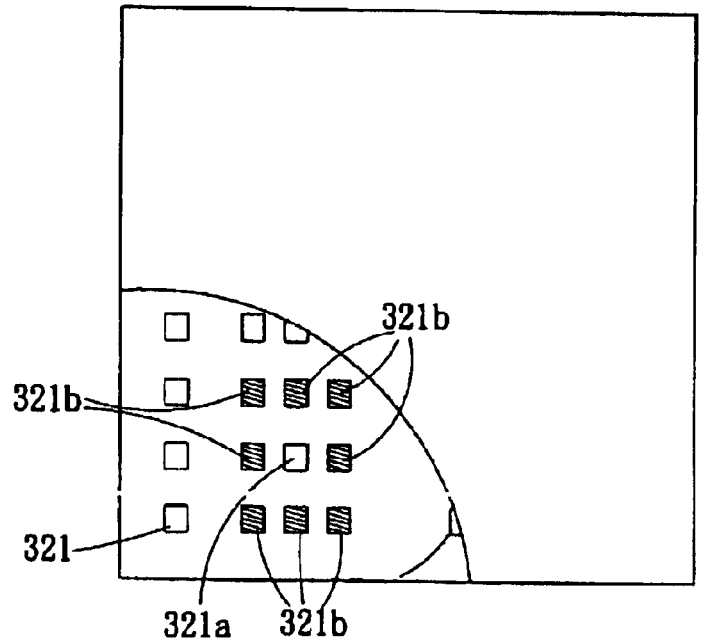
FIG. 4 is a bottom view showing partial of the substrate shown in FIG. 3.

The interconnection-wiring layer 33 is between the bottom surface of the first wiring layer 31 and the top surface of the second wiring layer 32. In the present embodiment, since the second pads 321 are arranged in an array, as shown in FIG. 4, several second pads 321b are located around the second pad 321a, which is not electrically connected with the first pads. Each second pad 321b is formed with the mentioned NC Ball, and electrically connects to the interconnection-wiring layer 33 via the via hole 34'. The interconnection-wiring layer 33 may be grounded to provide a ground level to the second pads 321. Alternatively, the interconnection-wiring layer 33 may electrically connect to a power source to provide a power source level to the second pads 321. It should be noted that the substrate 3 might have more than one interconnection-wiring layer. For example, the substrate 3 may have two interconnection-wiring layers: one connects to the power source while another connects to a ground.

It should be also noted that an isolation layer may be provided between the wiring layers to ensure the electric insulation between the wiring layers, and the only openings on the isolation layer are via holes 34 or 34'to electrically connect the first trace line 312 and the second trace line 322, or to electrically connect the second pads 321b and the interconnection-wiring layer 33.

Figure 5:
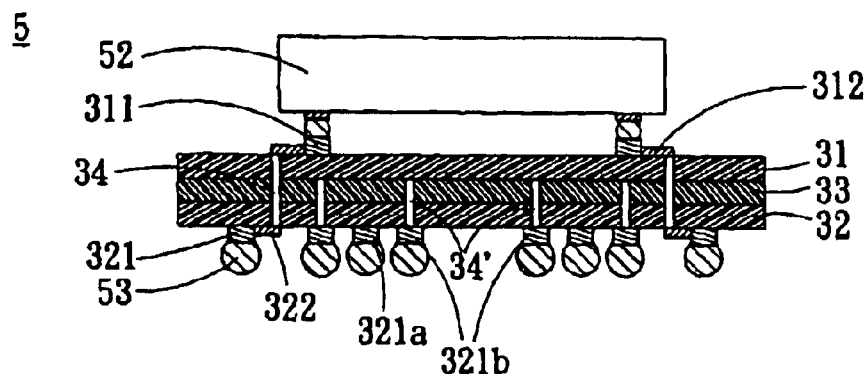
FIG. 5 is a schematic diagram showing a semiconductor device according to an embodiment of the invention having the substrate shown in FIG. 3.

Please refer to FIG. 5, the semiconductor device 5 according to an preferred embodiment of the invention includes the substrate 3 and a chip 52.

In the present embodiment, the substrate 3 is provided with a plurality of bumps 53, each of which connects to a corresponding second pad 321 including the second pads 321a and 321b. The chip 52 is attached on the first wiring layer 31 of the substrate 3, and the pads of the chip 52 are electrically connected to the first pads 311.

Figure 6:
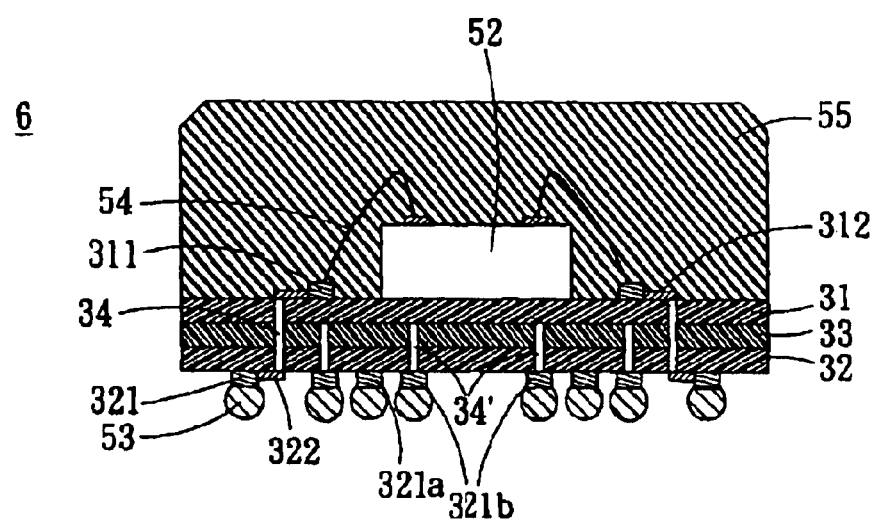
FIG. 6 is a schematic diagram showing a semiconductor device according to another embodiment of the invention having the substrate shown in FIG. 3.

It should be noted that, in the present embodiment, the chip 52 may be provided on the substrate by flip-chip technology. That is, the pads of the chip 52 connect to the first pads 311 via the bumps. The chip 52 may also be provided on the substrate 3 by wire-bonding. As shown in FIG. 6. in the semiconductor device 6 according to another embodiment of the invention, the chip 52 electrically connects to the first pads 311 via a plurality of bonding wires 54. To protect the chip 52 and the bonding wires 54, an epoxy molding 55 is provided to encapsulate the chip 52 and the bonding wires 54.

Figure 7:
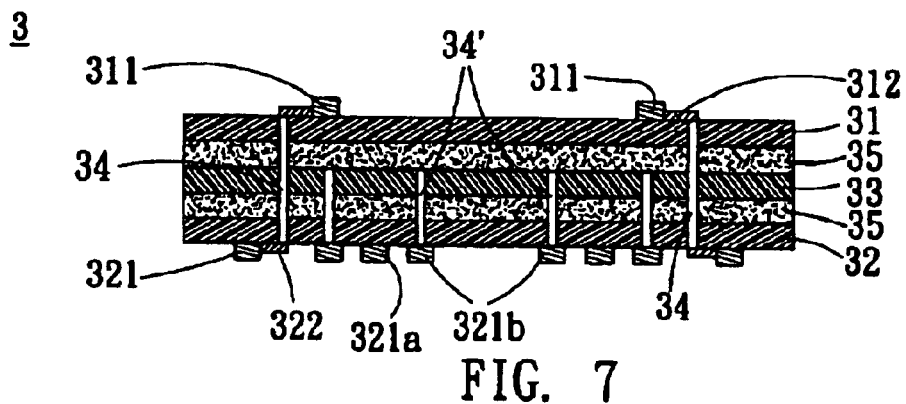
FIG. 7 is a schematic diagram having a substrate according to a third embodiment of the invention.
Figure 8:
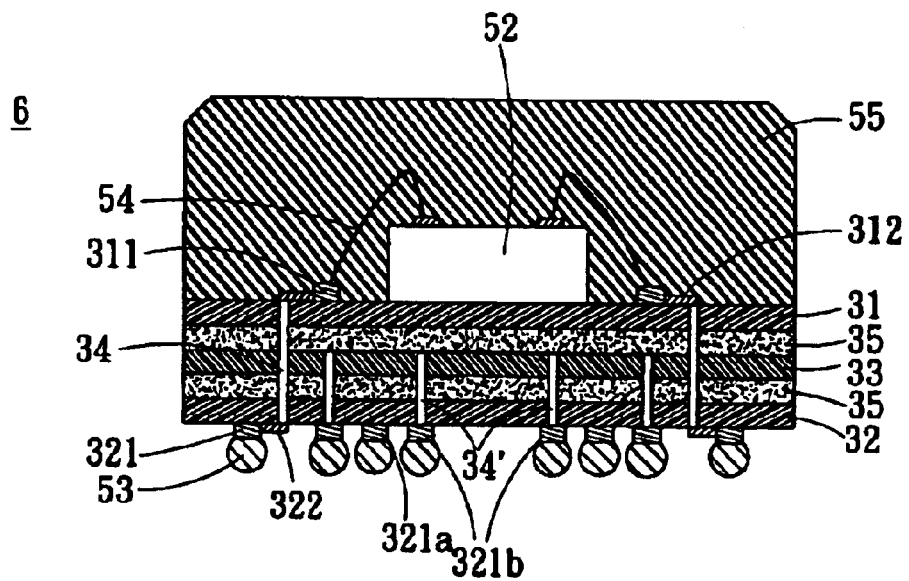
FIG. 8 is a schematic diagram showing a semiconductor device according to a fourth embodiment of the invention.

FIG. 7 shows another embodiment of the invention similar to claim 3 but having two additional isolation layers 35 on either side of interconnection-wiring layer 33. FIG. 8 is similar to FIG. 6 but includes two isolation layers 35 on either side of the interconnection-wiring layer 33 in a similar fashion.

To sum up, the substrate and the semiconductor device according to the embodiments of the invention can prevent the elastrostatic charges of the second pads not connecting to any of the first pads from flowing to neighboring second pads. This is accomplished by providing ground level or power level to the second pads located around the second pad, which is not connected with any of the first pads. Therefore, the electrostatic discharge protection capability of a semiconductor device could be improved significantly.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A substrate, comprising:
   a first wiring layer, the top surface of which is provided with a plurality of first pads;
   a second wiring layer, the bottom surface of which is provided with a plurality of second pads, at least one of the second pads is not electrically connected with the first pads; and
   an interconnection-wiring layer, which is provided between the bottom surface of the first wiring layer and the top surface of the second wiring layer, wherein at least one of the second pads, which is adjacent to the second pad not electrically connected with the first pads, is electrically connected with the interconnection-wiring layer to shield electrostatic discharges of said second pad not electrically connected with the first pads from flowing to neighboring second pads.

2. The substrate according to claim 1, wherein the second pads are arranged in an array.

3. The substrate according to claim 1, wherein the second pad, which is adjacent to the second pad not electrically connected with the first pads, is grounded via the interconnection-wiring layer.

4. The substrate according to claim 1, wherein the second pad, which is adjacent to the second pad not electrically connected with the first pads, is electrically connected with a power source via the interconnection-wiring layer.

5. The substrate according to claim 1, wherein a plurality of bumps are provided on the second pads, and the first pads are electrically connected with pads of a chip.

6. The substrate according to claim 1, further comprising:
   a plurality of isolation layers provided between the first wiring layer and the interconnection-wiring layer, and between the interconnection-wiring layer and the second layer.

7. A semiconductor device comprising:
   a substrate, which comprises
      a first wiring layer, the top surface of which is provided with a plurality of first pads,
      a second wiring layer, the bottom surface of which is provided with a plurality of second pads, at least one of the second pads is electrically unconnected with the first pads, and
      an interconnection-wiring layer, which is provided between the bottom surface of the first wiring layer and the top surface of the second wiring layer, wherein at least one of the second pads, which is adjacent to the second pad not electrically connected with the first pads, is electrically connected with the interconnection-wiring layer to shield electrostatic discharges of said second pad not electrically connected with the first pads from flowing to neighboring second pads; and
   a chip, which is provided on the first wiring layer of the substrate, pads of the chip being electrically connected with the first pads.

8. The semiconductor device according to claim 7, wherein the second pads are arranged in an array, and a plurality of bumps are provided on the second pads.

9. The semiconductor device according to claim 7, wherein the second pad, which is adjacent to the second pad not electrically connected with the first pads, is grounded via the interconnection-wiring layer.

10. The semiconductor device according to claim 7, wherein the second pad, which is adjacent to the second pad not electrically connected with the first pads, is electrically connected with a power source via the interconnection-wiring layer.

11. The semiconductor device according to claim 7, wherein the chip is provided on the substrate by flip-chip technology.

12. The semiconductor device according to claim 7, wherein the chip is provided on the substrate by wire bonding, and the semiconductor device further comprises:
   a plurality of bonding wires for connecting the pads of the chip and the first pads; and
   a molding encapsulating the chip and the bonding wires.

13. The semiconductor device according to claim 7, wherein the substrate further comprises:
   a plurality of isolation layers provided between the first wiring layer and the interconnection-wiring layer, and between the interconnection-wiring layer and the second layer.

* * * * *